United States Patent [19]
Bailey

[11] 3,940,631
[45] Feb. 24, 1976

[54] MAGNETIC BUBBLE LOGIC GATES

[75] Inventor: Paul T. Bailey, Creve Coeur, Mo.

[73] Assignee: Monsanto Company, St. Louis, Mo.

[22] Filed: Mar. 13, 1974

[21] Appl. No.: 450,875

[52] U.S. Cl... 307/88 LC; 340/174 TF; 340/174 SR
[51] Int. Cl.[2] ............... H03K 19/168; G11C 11/14
[58] Field of Search ............... 340/174 TF, 174 SR; 307/88 LC

[56] References Cited
UNITED STATES PATENTS

| | | | |
|---|---|---|---|
| 2,678,287 | 7/1972 | Chow | 340/174 TF |
| 3,735,145 | 5/1973 | Heinz | 340/174 TF |
| 3,736,577 | 5/1973 | Chang | 340/174 TF |
| 3,743,851 | 7/1973 | Kohara | 340/174 TF |
| 3,798,607 | 3/1974 | Minnick et al. | 340/174 TF |

OTHER PUBLICATIONS
IBM Tech. Disc. Bull. "Bubble Domain Logic Devices" by Lin; Vol. 13; No. 10; 3/71; pp. 3068, 3068a.
IBM Tech. Disc. Bull. "Bubble Domain Logic Circuits" by Lin; Vol. 13; No. 10; 3/71; pp. 3019, 3020.
IBM Tech. Disc. Bull. "Read/Write Control" by Walker; Vol. 13; No. 11; 4/71; pp. 3474, 3475.
IBM Tech. Disc. Bull. "Multiple Input Magnetic Bubble AND Gate" by Sakalay; Vol. 14; No. 12; 5/72.

*Primary Examiner*—Stanley M. Urynowicz, Jr.
*Attorney, Agent, or Firm*—Lane, Aitken, Dunner & Ziems

[57] ABSTRACT

Three magnetic bubble logic gates are disclosed in this application. One gate produces the AND and NAND logic functions, one gate produces the OR and NOR logic functions, and the third gate produces the majority function. In the gate providing the AND and NAND functions and in the gate providing the OR and NOR functions, a bubble generator applies magnetic bubbles at the binary variable rate to a first bubble propagation track, which diverges into two downstream tracks with the bubble being transmitted through the point of divergence to a preferred one of the two downstream tracks unless repelled to the unpreferred downstream track. Bubbles representing the binary variables are applied to data propagation tracks which approach the point of divergence in the first track. In the gate providing the AND and NAND functions, this approach is only close enough so that simultaneous bubbles representing both binary variables are required to repel a bubble at the point of divergence to the unpreferred track. In the gate providing the OR and NOR functions, the approach of the tracks containing the binary variables is sufficiently close that a bubble on either of these tracks will repel a bubble at the point of divergence to the unpreferred track. In the gate providing the majority function, five adjacent tracks are provided to which binary variables are applied. A bridging pattern of circuit elements is provided extending across the tracks which bridging pattern increases in density from track to track with the increase in density being in the same direction between each adjacent pair of tracks.

11 Claims, 7 Drawing Figures

FIG. 5.
FIG. 6.
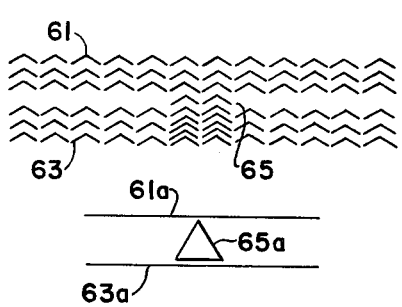
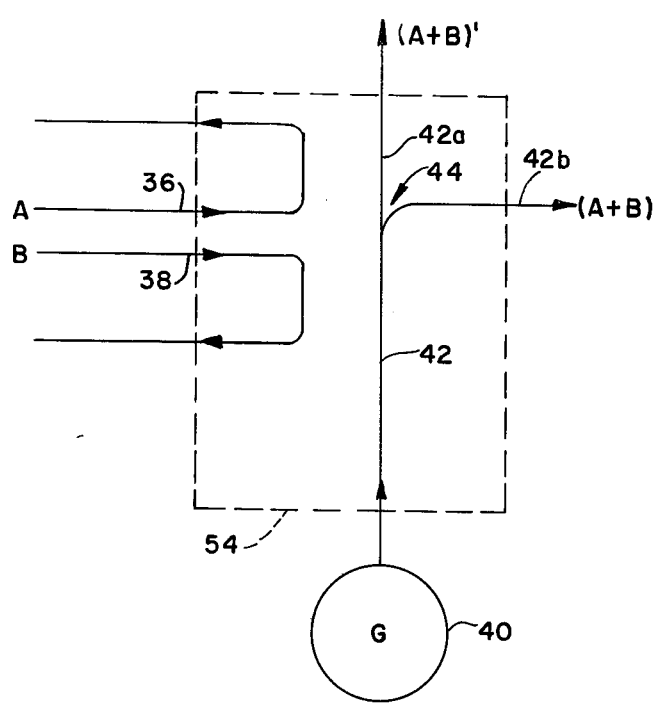
FIG. 7.

MAGNETIC BUBBLE LOGIC GATES

BACKGROUND OF THE INVENTION

The invention relates generally to the field of magnetic bubble technology (MBT) and more particularly to logic arrangements utilizing the capabilities of single wall magnetic domain devices.

The continuing evolution of MBT has now reached the point where large scale application to various data processing is practicable. Current interest in MBT is due primarily to the prospect of extremely high bit packing density, low power consumption and reliability for low cost means memories.

Briefly, MBT involves the creation and propagation of single wall magnetic domains in specially prepared magnetic materials. The application of a static uniform magnetic bias field orthogonal to a sheet of magnetic material having suitable uniaxial anisotropy causes the normally random serpentine pattern of magnetic domains to contract or shrink into short cylindrical figurations or bubbles whose common polarity is opposite that of the bias field. The bubbles repel each other and can be moved or propagated by a magnetic field in the plane of the sheet.

Many schemes now exist for propagating the bubbles along the sheet in predetermined channels. One propagation system includes permalloy circuit elements shaped like military uniform stripes or "chevrons" spaced end-to-end in a thin layer over the sheet of magnetic material to define a bubble propagation track. The drive or propagation field is continuously rotating in the plane of the sheet causing each chevron to act as a small magnet whose poles are constantly changing. As the drive field rotates, a bubble under one of the chevrons is moved along the chevron propagation track from point to point in accordance with its magnetic attraction to the nearest attracting temporary pole of the circuit elements. This system is among those referred to as "field-access" as distinguished from other systems employing loops of conductors disposed over the magnetic field.

The use of MBT in data processing stems from the fact that the bubbles can be propagated through their channels at a precisely determined rate so that uniform data streams of bubbles are possible in which the presence or absence of a bubble indicates a binary 1 or 0. The use of MBT for performing logic operations is based on the fact that close magnetic bubbles tend to repel each other. Thus, if alternate paths with varying degrees of preference are built into the chevron circuit, the direction which a bubble on one channel ultimately takes may be influenced by the presence or absence of a bubble on another closely spaced channel. Logic systems capitalizing on this principle are shown in the copending application Ser. No. 283,267, entitled MAGNETIC BUBBLE LOGIC FAMILY, filed Aug. 23, 1972 by Paul T. Baily, Robert C. Minnick, Robert M. Sandfort and Warren L. Semon, and assigned to the assignee of this application.

Besides the inherent capability of performing logic with magnetic domains, one other aspect of MBT has given impetus to logic development. MBT was originally envisioned as a mass memory but the most difficult problem has been encountered in readout. Optical devices utilizing the Faraday effect and magnetoresistive devices have been used, but are not entirely satisfactory. Therefore, it is important to minimize readout to the extent possible by incorporating logic in the memory so that the magnetic bubbles representing information can be logically manipulated before readout is necessary.

SUMMARY OF THE PRESENT INVENTION

The present invention provides simple magnetic bubble gates operating on binary variables. In one of the gates, the OR and NOR functions are achieved. In a second gate, the AND and NAND functions are achieved. The third gate is a majority gate for five or more variables. In the gate providing the OR and NOR functions and the gate providing the AND and NAND functions, a bubble generator produces bubbles at a rate that binary variables represented by presences and absences of bubbles are applied to two data inputs of the gate. The bubbles produced by the bubble generator are directed by a bubble propagation track to a point where the track diverges into two tracks. The two tracks downstream from the point of divergence are designed so that the bubbles prefer one track over the other. The bubbles representing the binary variables are applied to bubble propagation tracks which both pass near to the point of divergence in the track on which the generated bubbles are applied. In the gate providing the OR and NOR functions, both tracks on which the binary variables are applied pass near enough to the point of divergence so that a bubble on either data track will cause the corresponding bubble from the generator to be repelled by magnetic repulsion to the unpreferred track. If the bubbles on the data tracks represent the binary variables A and B with the presence of a bubble representing a binary 1 and the absence of a bubble representing binary 0, then the gate in the above described embodiment will produce on the preferred track downstream from the point of divergence bubbles representing the logic function (A + B)' and on the unpreferred track, the logic function (A + B).

In the gate providing the AND and NAND functions, the two data tracks also pass by the point of divergence, but only close enough so that a corresponding bubble produced by the generator will be repelled to the unpreferred channel if bubbles are simultaneously on both of the data tracks. If the bubbles on the data tracks represent binary variables A and B, respectively, with presence of bubbles representing a binary 1 and the absence of bubbles representing a binary 0, then with this latter gate, the binary logic function (A·B) will be produced on the unpreferred track and (A·B)' will be produced on the preferred track.

The variable majority gate of the invention is an improvement on the variable majority gate as shown in FIG. 5 of the above mentioned copending application Ser. No. 283,267. The variable majority gate disclosed in this copending application is a three-variable gate. The present invention provides majority gates with an odd number of input variables of five or more. In accordance with the present invention, an odd number of adjacent bubble propagation tracks, at least five in number, are provided. Bridging patterns of circuit elements are provided between the adjacent tracks. Each bridging pattern increases in density proceeding from the upper track toward the lower track so that any bubble unless repelled by a simultaneous bubble on an adjacent track will be transmitted to the lower tracks. The tracks are spaced so that the repelling influence of any bubble only extends for two track spacings or less.

This structure results in the majority function of the input variables being produced on the uppermost track of the gate.

Accordingly, an object of the present invention is to provide improved, simple magnetic bubble gates. A further object of the present invention is to achieve the AND and NAND functions in an improved magnetic bubble gate. Another object of the present invention is to achieve the OR and NOR functions in an improved magnetic bubble gate. A still further object of the present invention is to provide a gate providing the majority function of five or more input variables. Further objects and advantages of the invention will be apparent from the drawings of the invention and the following detailed description of the invention.

BRIEF DESCRIPTION OF THE DRAWINGS

FIG. 5 is a schematic illustration of a magnetic bubble gate in accordance with the invention producing the AND and NAND functions;

FIG. 6 illustrates a bridging pattern of chevrons between a pair of adjacent bubble propagation tracks used in the gate of the present invention providing the majority function and also illustrates the symbology to represent this kind of bridging pattern between adjacent tracks; and FIG. 7 is a schematic diagram illustrating the gate of the present invention providing the majority function.

DESCRIPTION OF THE PREFERRED EMBODIMENTS

The word "bubble" used through this text is intended to encompass any single-walled magnetic domain, defined as a domain having an outer boundary which closes on itself. The manner of bubble propagation is an important factor in the implementation and the performance of the logic circuits described below. However, this invention in its broader aspects is not limited of necessity to chevron circuit elements nor even to field accessed circuit elements, although it is recognized that it is a decided advantage to utilize individual circuit elements which pack very closely such as chevrons.

Figure 1:
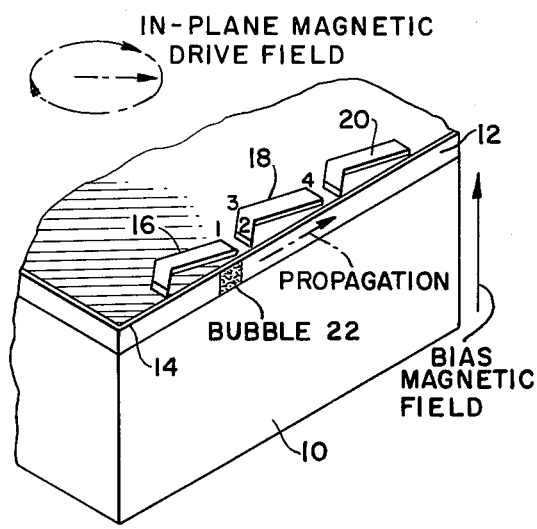
FIG. 1 is a schematic fragmentary perspective view of a bubble propagation track.
Figure 2:
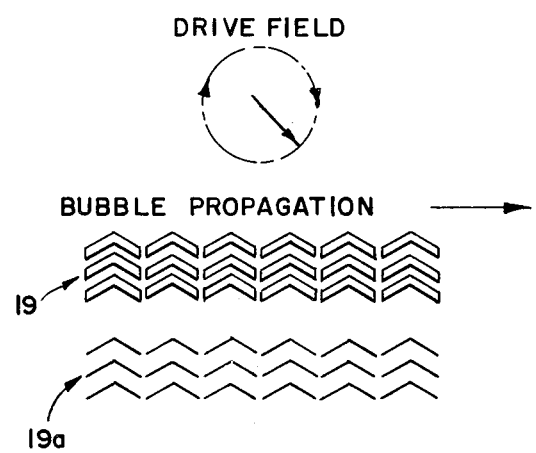
FIG. 2 is a plan view of a bubble propagation track employing stacked chevron circuit elements and illustrates a representation thereof exemplifying a technique for illustrating patterns of circuit elements.

FIG. 1 illustrates the basic components of a field-accessed garnet bubble chip. A substrate 10 of nonmagnetic garnet supports an epitaxial magnetic bubble garnet layer 12 and a spacing layer 14 of silicon oxide, $SiO_2$, to which permalloy chevron circuit elements 16, 18 and 20 are bonded. The chip is subjected to a magnetic bias field orthogonal to the plane of the bubble garnet layer 12. In the presence of a bias field of suitable strength a cylindrical bubble 22 is maintained in the bubble garnet layer 12. A rotating in-plane magnetic drive field causes the bubble 22 to propagate along the track defined by the chevron circuit elements 16, 18 and 20 which are spaced from each other in alignment end-to-end. The bubble 22 behaves as if it were a mobile vertical bar magnet with a polarization opposite to that of the bias field. When the rotating drive is oriented as shown in FIG. 2, the bubble seeks an energy minimum under pole 1 of chevron 16. As the drive field is uniformly rotated clockwise through one period, 360°, the bubble 22 moves through positions 2 and 3 to position 4 on the next chevron 18, which corresponds to position 1 on chevron 16. Thus, the length of each chevron corresponds to one complete cycle of the drive field. For this reason, the bubble 22 is propagated along the propagation track in a completely determinate fashion.

For the purpose of guarding against defects in the garnet bubble material as well as in the permalloy chevrons themselves, the chevrons may be packed as shown in FIG. 2 to form a multi-element propagation track 19. In the absence of other magnetic influence, a bubble will be propagated to the right as viewed in FIG. 2 down the middle of the track when subjected to a clockwise rotating drive field as shown in FIG. 2. It is convenient to illustrate a pattern of chevrons by showing the individual chevrons as single lines as is done by representation 19a of the track 19.

Figure 3:
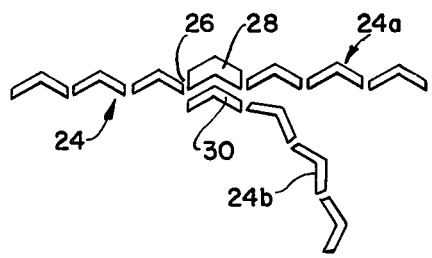
FIG. 3 illustrates the chevron pattern to provide a bubble propagation track which diverges into two propagation tracks with one track being preferred by the bubbles transmitted on the track unless repelled to the unpreferred track.

FIG. 3 illustrates a magnetic bubble propagation track 24 which diverges into two propagation tracks 24a and 24b at a point 26. It will be noted that the chevron 28 immediately downstream from the divergence point 26 is made larger than the other chevrons, and in particular, is made larger than the chevron 30 in channel 24b immediately downstream from the divergence point 26. Because the element 28 is larger than the element 30, a bubble travelling along track 24 absent any other external influences will be transmitted through the divergence point 26 to track 24a rather than track 24b because the magnetic influence produced by the larger chevron 28 will be stronger than that produced by the chevron 30. If, however, a bubble were positioned just above the divergence point 26, then a bubble travelling along track 24 would be repelled by the adjacent bubble at the divergence point and be transmitted from the divergence point down track 24b. This same effect could be achieved using bubble propagation tracks defined by multiple chevron circuit elements and making the multiple chevron circuit elements greater in number and closer together in the preferred path immediately downstream from the point of divergence relative to the unpreferred path.

Figure 4:
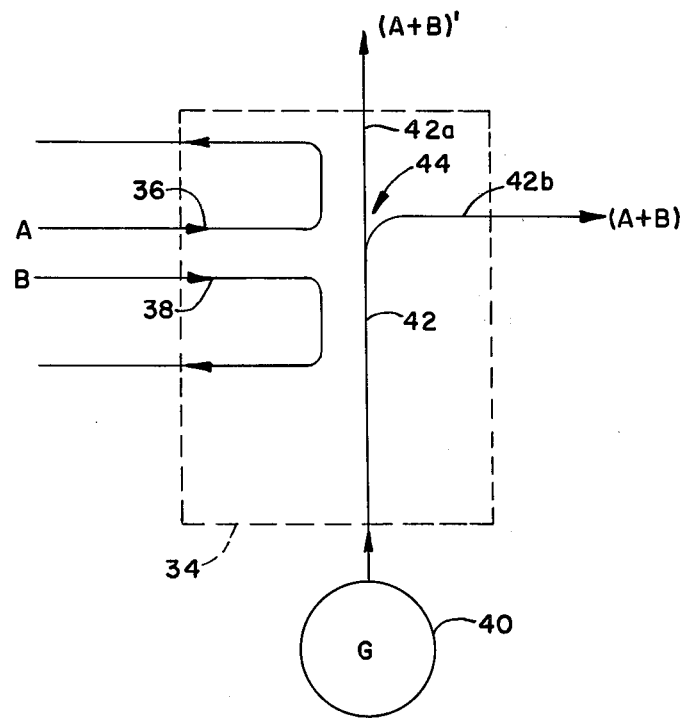
FIG. 4 is a schematic illustration of a magnetic bubble gate in accordance with the invention producing the OR and NOR functions.

The bubble gate as shown in FIG. 4 designated generally by the reference number 34 produces the OR and NOR functions. In this gate, magnetic bubbles representing binary variables represented by A and B are applied to bubble propagation tracks 36 and 38, respectively. These propagation tracks may be made up of chevron circuit elements as illustrated in FIG. 1 or FIG. 2. As seen in FIG. 1, bubbles may be at the corresponding poles of each of the chevrons. The presence of a bubble in such a position represents a binary 1 and the absence of a bubble in such position represents a binary 0. The strings of 1's and 0's represented by the presences or absences of the bubbles will move through the propagation tracks 36 and 38 continuously as the drive field rotates. A generator 40 generates magnetic bubbles at the same rate that binary variables are applied to the track 36 and also at the same rate that binary variables are applied to the track 38. Thus, the generator will produce a bubble corresponding to each corresponding pair of binary variables on the two tracks 36 and 38. The bubbles generated by the generator 40 are transmitted by a bubble track 42 which diverges into propagation tracks 42a and 42b at a point 44. The tracks 42a and 42b are designed so that the track 42a is preferred over the track 42b and bubbles on the track 42 will travel through the point of divergence 44 to the track 42a rather than to the track 42b unless the bubble is repelled by an external repelling force at the point of divergence. The tracks 42a and 42b at the point of divergence 44 may be implemented by chevron circuit elements as described above with reference to FIG. 3.

The tracks 36 and 38 are arranged to pass closely adjacent to the point of divergence 44 so that a bubble on the track 36 or a bubble on the track 38 will cause the corresponding bubble generated by the generator 40 at the point of divergence 44 to be repelled to the track 42b rather than be transmitted to the track 42a. Thus, if a bubble occurs in either track 36 or 38, a corresponding bubble will be produced on track 42b. If an absence of a bubble occurs in the corresponding position on both tracks 36 and 38, then a bubble corresponding to this pair of absences will be transmitted to track 42a. Thus, the output of track 42a represents the binary function (A + B)' and the output on track 42b represents the binary function (A + B).

The gate of the invention shown in FIG. 5 is designated generally by the reference number 54. This gate has the same general configuration as the gate shown in FIG. 4 and the corresponding portions of the gate 54 have been labelled with corresponding reference numbers. The propagation track 42, the point of divergence 44 and the downstream tracks 42a and 42b are all identical to these tracks in the gate 34. Binary variables A and B are applied to tracks 36 and 38 just as in the gate 34 and these tracks pass in the vicinity of the point of divergence 44. A generator 40 applies bubbles to track 42 at the same rate that the pairs of binary variables are applied to the tracks 36 and 38 so that a bubble is applied to the track 42 for each pair of binary variables applied to the tracks 36 and 38. The gate 54, however, differs from the gate 34 in that the tracks 36 and 38 do not pass as near to the point of divergence 44 as do these tracks in the gate 34 so that a bubble on the track 42 at the point of divergence 44 will be repelled to the unpreferred downstream track 42b only if corresponding bubbles are on both tracks 36 and 38 simultaneously adjacent to the point of divergence. As a result, the bubble will be transmitted to the track 42b only if corresponding bubbles are on both tracks 36 and 38 and a bubble will be transmitted to track 42a for each pair of binary variables is which bubbles are not present on both input tracks. Accordingly, if the input variables on tracks 36 and 38 of the gate 54 are represented by A and B, then the function produced on track 42a will be (A·B)' and the function produced on track 42b will be (A·B).

In both of the gates 34 and 54 shown in FIGS. 4 and 5, the binary variables A and B are conserved. Thus, in addition to producing the output functions on tracks 42a and 42b, these gates also provide simultaneously therewith the binary variables A and B. The tracks 36 and 38 in the gates of FIGS. 4 and 5 are shown as approaching the point of divergence 44 adjacent to one another and then diverge away from each other at the point of divergence. Instead, the direction of travel on these tracks could be reversed so that the bubbles approach the point of divergence apart from one another and then travel away from the point of divergence on adjacent channels. Alternatively, the direction of travel on either one of the tracks alone could be reversed leaving the direction of travel on the other channel in the same direction.

FIG. 6 illustrates a chevron pattern employing stacked chevron elements defining two adjacent bubble propagation tracks 61 and 63 with a bridging pattern of chevron elements 65 extending between the two tracks. The density of the stacked chevron elements in the bridging pattern 65 increases going from the track 61 to the track 63. The increase in density of the chevrons extends across the width of the track 65 at the bridging pattern 65. As a result of the pattern of circuit elements, a bubble travelling along the track 61 will transfer to the track 63 through the bridging pattern 65 unless the bubble on the track 61 is repelled by a bubble on the track 63 or another bubble in the vicinity of the track 63. If a bubble should come adjacent to and below the track 63, it would repel a bubble on track 63 through the bridging pattern 65 to the track 61. This type of bridging circuit element between two adjacent tracks is described in the above mentioned copending application Ser. No. 283,267 and is schematically illustrated by the symbols 61a, 63a and 65a, 61a and 63a representing the bubble tracks 61 and 63 and the triangle 65a representing the bridging pattern 65 which will cause a bubble to transfer from the track 61 to 63 unless repelled. The increase in density may be achieved by crowding the circuit elements closer together as illustrated in FIG. 6 or alternatively, the density increase may be achieved by making the individual circuit elements thicker.

The bridging pattern of circuit elements with increasing density as illustrated in FIG. 6 is used in the majority gate of the present invention which is schematically illustrated in FIG. 7. As shown in FIG. 7, five adjacent parallel bubble tracks 71–75 are provided, which bubble tracks may be of the type illustrated in FIG. 6. Patterns of bridging circuit elements 81–84 of the type illustrated in FIG. 6 are provided between each adjacent pair of tracks at the same relative position on each of the five tracks. The bridging patterns 81–84 all increase in density in the same direction, going from the upper track to the lower track. The bridging patterns 81–84 may be considered a single bridging pattern which extends across all of the tracks and in which the density of the circuit elements increases from the track 71 to the track 75. The five tracks are spaced so that a bubble in any one of the tracks 71–75 will have a repulsion effect extending for two tracks spacings. Thus, a bubble on track 75 by the repulsion effect on a simultaneous bubble on track 73 will prevent the bubble on track 73 from being transmitted through the bridging pattern 83 to the track 74. A bubble on the track 75 will also repel a simultaneous bubble on track 74 and cause it to be transmitted through the bridging pattern 83 to the track 73. On the other hand, the spacing of the track is selected so that the repulsion effect of a bubble on track 75 will be insufficient to repel a bubble on track 73 through the bridging pattern 82 to the track 72 and a bubble on track 71 or 72 will be transferred to track 73 in the presence of a simultaneous bubble on track 75. The bridging patterns are designed so that a single bubble on channel 71 will be transmitted by the bridging patterns all the way down to the track 75 absent any bubbles on the other tracks 72–75. Thus, any single bubble applied to the tracks 71–75 will be transmitted by the bridging patterns to the track 75 and a bubble will be produced at the output end of the track 75 if one or more bubbles are applied to the inputs of any of the tracks 71–75. If just two bubbles are applied to any two of the tracks, one of the bubbles will be transmitted to the output end of the track 75 and the other bubble will be transmitted to the output end of the track 73. If three or more bubbles are applied to the tracks, one of the bubbles will be transmitted to the output end of the track 75, one of the bubbles will be transmitted to the output end of the track 73, and one of the bubbles will be transmitted to the output end of the track 71. It will be observed that the bridging pattern of circuit elements must be capable of transferring a bubble from track 71 to track 75 by the gradient in the density of the circuit elements and be capable of transferring a bubble from the track 73 to the track 71 by bubble repulsion. In order to insure the reliability of transfer over a plurality of tracks, the number of circuit elements in the bridging circuit can be increased to increase the dimension of the bridging pattern in the direction of propagation of bubbles so that the bubbles are in the bridging pattern for a greater number of drive field cycles.

If the bubbles applied to the inputs of tracks 71–75 represent the binary variables V, W, X, Y and Z, with the presence of a bubble representing 1 and the absence of a bubble representing 0, the output from the track 71 will be the majority function of the variables $V, W, X, Y$ and $Z$ which more specifically is:

$$VWX + VWY + VWZ + VXY + VXZ + VYZ + WXY + WXZ + WYZ + XYZ$$

This logic function is called the majority function since it will have a bubble at its output or a binary 1 at its output if a bubble or a binary 1 is applied to a majority of the inputs. The track 72 will generate the logic function VWXYZ. The channel 73 will generate the function $$VW + VX + VY + VZ + WX + WY + WZ + XY + XZ + YZ.$$

The track 74 will generate the function
$$VWXY + VWXZ + VWYZ + VXYZ + WXYZ.$$
The channel 75 will generate the function
$$V + W + X + Y + Z.$$

It is clear the the approach used in the gate shown in FIG. 7 generalizes to a seven variable majority gate, a nine variable majority gate, etc. In other words, the approach generalizes to a $2N + 1$ variable majority gate where N is any integer. With the larger number of variables, it may be necessary to increase the number of circuit elements in the bridging pattern to extend its dimension in the direction of bubble propagation along the tracks.

The above description is of preferred embodiments of the present invention and many modifications in addition to those already described above may be made to the disclosed specific embodiments without departing from the spirit and scope of the invention.

I claim:

1. A magnetic bubble gate comprising means defining a first magnetic bubble propagation track diverging at a point of divergence into downstream second and third magnetic bubble propagation tracks, said propagation tracks comprising means for transmitting a magnetic bubble in said first track through said point of divergence to said second track unless the bubble is repelled by bubble repulsion to said third track at said point of divergence, fourth and fifth magnetic bubble propagation tracks for receiving magnetic bubbles representing binary variables located on the same side of said first, second and third tracks such that said point of divergence lies between said third track on the one hand and said fourth and fifth tracks on the other hand, said fourth and fifth tracks approaching at least near enough to said point of divergence that simultaneous bubbles on both of said fourth and fifth tracks will repel a simultaneous bubble at said point of divergence to said third track, and a bubble generator for applying a bubble to said first track at the same rate that binary variables are received by said fourth and fifth tracks.

2. A magnetic bubble logic gate as recited in claim 1, wherein said bubble tracks are defined by magnetic circuit elements in the form of chevrons.

3. A magnetic bubble gate are recited in claim 1, wherein said fourth and fifth tracks are sufficiently spaced from said point of divergence so that a magnetic bubble at said point of divergence will be repelled to said third track only by simultaneous magnetic bubbles on both said fourth and fifth tracks.

4. A magnetic logic gate as recited in claim 3, wherein said bubble tracks are defined by magnetic circuit elements in the form of chevrons.

5. A magnetic bubble gate as recited in claim 1, wherein said fourth and fifth tracks approach sufficiently near to said point of divergence that a magnetic bubble on either said fourth track or on said fifth track will repel a simultaneous bubble at said point of divergence to said third track.

6. A magnetic bubble logic gate as recited in claim 5, wherein said bubble tracks are defined by magnetic circuit elements in the form of chevrons.

7. A magnetic bubble logic gate comprising means defining at least five adjacent magnetic bubble propagation tracks, means to apply simultaneously to the inputs of said tracks presences and absences of bubbles to represent on each track a different binary variable with one value of the binary variables being represented by the presence of a magnetic bubble and the other value being represented by the absence of a bubble, a bridging pattern of circuit elements extending across all of said tracks comprising means to transmit bubbles between said tracks and to the output of a selected one of said tracks only if simultaneous bubbles are applied to the inputs of the majority of all of said tracks.

8. A magnetic bubble logic gate as recited in claim 7, wherein said bubble tracks and said bridging pattern are defined by magnetic circuit elements in the form of chevrons.

9. A magnetic bubble logic gate comprising means defining at least five adjacent magnetic bubble propagation tracks, a bridging pattern of circuit elements extending across all of said tracks arranged with increasing density preceeding each track to the adjacent track, the direction of increase of density being the same for the bridging pattern between each adjacent pair of tracks, said bridging pattern comprising means to transmit bubbles between said tracks and to transmit a bubble to the output to a selected one of said tracks only if simultaneous bubbles are applied to the inputs of a majority of all of said tracks.

10. A magnetic bubble logic gate as recited in claim 9, wherein said bubble tracks and said bridging pattern are defined by magnetic circuit elements in the form of chevrons.

11. A method of determing whether the majority of a predetermined number of binary variables has a predetermined one of the two binary values one and zero within said predetermined number has a value of at least five, comprising the steps of providing said predetermined number of adjacent magnetic bubble propagation tracks with a bridging pattern extending across all of said tracks constructed to transmit bubbles between said tracks and to the output of a selected one of said tracks only if simultaneous bubbles are applied to the inputs of the majority of said tracks, assigning a different one of said binary variables to each of said tracks and applying simultaneously to the inputs of each of said tracks a magnetic bubble only if the binary variable assigned to such track has said predetermined one of said two binary values whereby a bubble is produced at the output of said selected one of said tracks only if a majority of said binary variables have said predetermined one of the two binary values.

* * * * *